United States Patent
Nakatsuka et al.

(10) Patent No.: US 9,484,870 B2
(45) Date of Patent: Nov. 1, 2016

(54) SEMICONDUCTOR INTEGRATED CIRCUIT DEVICE

(71) Applicant: Kabushiki Kaisha Toshiba, Minato-Ku, Tokyo (JP)

(72) Inventors: Shinji Nakatsuka, Kamakura Kanagawa (JP); Shigeo Imai, Chiba Chiba (JP); Yosuke Ogawa, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/638,630

(22) Filed: Mar. 4, 2015

(65) Prior Publication Data

US 2016/0276989 A1 Sep. 22, 2016

(30) Foreign Application Priority Data

Mar. 25, 2014 (JP) .................. 2014-062395

(51) Int. Cl.
| | |
|---|---|
| *H03F 1/02* | (2006.01) |
| *H03F 3/393* | (2006.01) |
| *H03F 3/45* | (2006.01) |
| *H03F 3/00* | (2006.01) |
| *H03F 1/30* | (2006.01) |

(52) U.S. Cl.
CPC .......... *H03F 3/393* (2013.01); *H03F 3/45179* (2013.01); *H03F 1/303* (2013.01); *H03F 3/005* (2013.01); *H03F 2200/249* (2013.01); *H03F 2200/271* (2013.01); *H03F 2200/312* (2013.01); *H03F 2203/45116* (2013.01); *H03F 2203/45248* (2013.01)

(58) Field of Classification Search
CPC ........................... H03F 3/45179; H03F 3/393
USPC ..................... 330/9; 327/124, 307
See application file for complete search history.

(56) References Cited

U.S. PATENT DOCUMENTS

| | | | |
|---|---|---|---|
| 6,621,334 B2 * | 9/2003 | Ausserlechner | H03F 3/38 330/9 |
| 7,265,703 B2 | 9/2007 | Sasaki et al. | |
| 7,589,587 B2 * | 9/2009 | Yoshida | H03F 3/387 330/9 |
| 7,786,794 B2 | 8/2010 | Murakami | |
| 7,893,855 B2 * | 2/2011 | Huang | H03F 1/0277 341/143 |
| 8,026,760 B1 * | 9/2011 | Prasad | H03F 3/005 330/9 |
| 2006/0055456 A1 * | 3/2006 | Niederkorn | H03F 1/02 330/9 |
| 2014/0077872 A1 * | 3/2014 | Nagahisa | H03F 3/387 330/9 |

FOREIGN PATENT DOCUMENTS

| | | |
|---|---|---|
| JP | 2006-074433 A | 3/2006 |
| JP | 2008-067050 A | 3/2008 |
| JP | 2009-225188 A | 10/2009 |

* cited by examiner

*Primary Examiner* — Khanh V Nguyen
(74) *Attorney, Agent, or Firm* — White & Case LLP

(57) ABSTRACT

A device includes an operational-amplifier including an amplifier-part amplifying signals and transmitting amplified signals to a first and a second nodes, and an output-part connected to the first and second nodes and outputting signals from a first and a second outputs. The device includes a first and a second chopper switches and a first and second phase-compensation capacity elements. A first capacitance switch switches between a first connection-state and a second connection-state. In the first connection-state, the first phase-compensation-capacity element is connected between the first node and the first output and the second phase-compensation-capacity element is connected between the second node and the second-output. In the second connection state, the first phase-compensation-capacity element is connected between the second-node and the second output and the second phase-compensation-capacity element is connected between the first node and the first output.

16 Claims, 3 Drawing Sheets

SEMICONDUCTOR INTEGRATED CIRCUIT DEVICE

CROSS REFERENCE TO RELATED APPLICATIONS

This application is based upon and claims the benefit of priority from the prior Japanese Patent Application No. 2014-062395, filed on Mar. 25, 2014, the entire contents of which are incorporated herein by reference.

FIELD

The embodiments of the present invention relate to a semiconductor integrated circuit device.

BACKGROUND

Conventionally, in an operational amplifier, there is a case where a DC (Direct Current) offset voltage and 1/f noise are generated. When an operational amplifier is used for DC measurement or used as a high-precision ADC (Analogue Digital Converter), such DC offset value and 1/f noise cannot be ignored. Therefore, in order to handle the DC offset voltage and 1/f noise, a chopper operational amplifier that utilizes chopper stabilization is frequently used.

However, when a signal is switched by a chopping operation of a chopper operational amplifier, the charge state of a phase compensation capacity element provided in the chopper operational amplifier is shifted at the same time. Because the phase compensation capacity element has a relatively large capacitance, the shifting of the charge state of the phase compensation capacity element takes a long time. Meanwhile, when a slew rate is increased in order to shorten the time for shifting the charge state of the phase compensation capacity element, the consumption power therefor is increased. Therefore, in the chopper operational amplifier, there has been desired a technique of performing shifting the charge state of the phase compensation capacity element in a short time while suppressing the consumption power therefor.

DETAILED DESCRIPTION

Embodiments will now be explained with reference to the accompanying drawings. The present invention is not limited to the embodiments.

A semiconductor integrated circuit device according to an embodiment includes an operational amplifier including an amplifier unit amplifying signals input in a first input port and a second input port and transmitting amplified signals to a first node and a second node, and an output unit being connected to the amplifier unit t at the first and second nodes and outputting signals amplified at the amplifier unit from a first output port and a second output port. A first chopper switch unit modulates a first signal and a second signal and inputs these signals in the first and second input ports. A second chopper switch unit demodulates and outputs signals output from the first and second output ports.

A first capacitance switching unit switches between a first connection state and a second connection state. In the first connection state, a first phase compensation capacity element is connected between the first node and the first output port and a second phase compensation capacity element is connected between the second node and the second output port. In the second connection state, the first phase compensation capacity element is connected between the second node and the second output port and the second phase compensation capacity element is connected between the first node and the first output port.

First Embodiment

Figure 1:
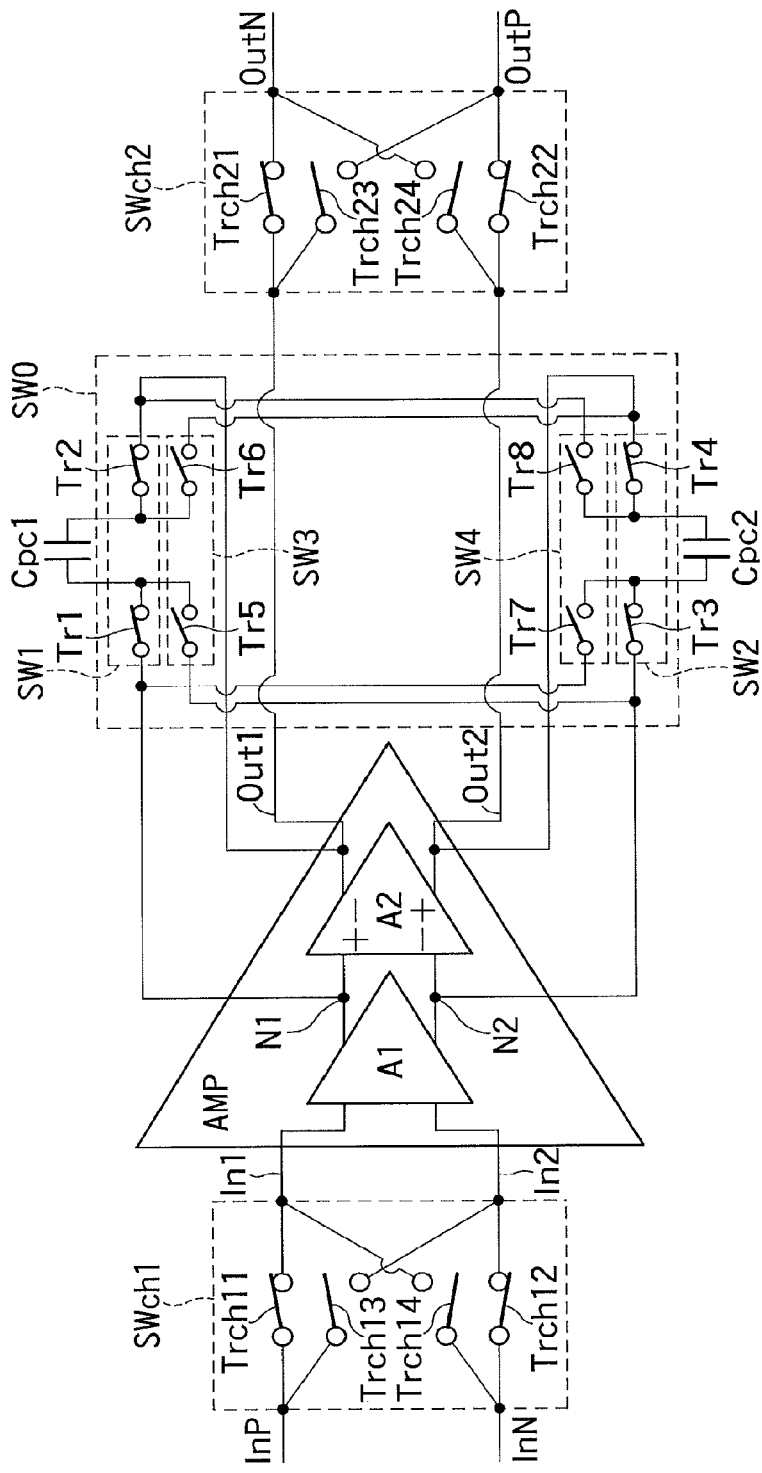
FIG. 1 shows a configuration example of a chopper operational amplifier device 1 according to a first embodiment.

FIG. 1 shows a configuration example of a chopper operational amplifier device 1 (hereinafter, also simply "amplifier device 1") according to a first embodiment. The amplifier device 1 includes an operational amplifier AMP as an operational amplifier, a first chopper switch unit SWch1, a second chopper switch unit SWch2, a first phase compensation capacity element Cpc1, a second phase compensation capacity element Cpc2, and a first capacitance switching unit SW0.

The operational amplifier AMP includes a first input port In1, a second input port In2, a first output port Out1, a second output port Out2, an amplifier stage (an amplifier unit) A1, and an output stage (an output unit) A2. The first input port In1 and the second input port In2 receive a first signal (a positive-side analog signal, for example) and a second signal (a negative-side analog signal, for example) from the first chopper switch unit SWch1. The amplifier stage A1 amplifies a signal difference (a voltage difference) between the first signal and the second signal received in the first input port In1 and the second input port In2. For example, the amplifier stage A1 can be formed of a differential amplifier circuit. Two outputs of the amplifier stage A1 are connected to two inputs of the output stage A2 at nodes N1 and N2. The output stage A2 outputs the first signal and the second signal amplified at the amplifier stage A1 from the first output port Out1 and the second output port Out2.

The first chopper switch unit SWch1 is provided between input ports InP and InN of the amplifier device 1 and the input ports In1 and In2 of the operational amplifier AMP, and includes switches Trch 11 to Trch 14. It is assumed here that the first signal is input in the input port InP and the second signal is input in the input port InN. The switch Trch11 is connected between the input port InP and the input port In1. The switch Trch12 is connected between the input port InN and the input port In2. The switch Trch13 is connected between the input port InP and the input port In2. The switch Trch14 is connected between the input port InN and the input port In1. For example, each of the switches Trch11 to Trch14 can be a switch constituted by a CMOS (Complementally Metal-Oxide Semiconductor) transistor.

The switches Trch11 and Trch13 perform a switching operation in a mutually complimentary manner, so that when one of these switches is in an on-state, the other one is in an off-state. The switches Trch12 and Trch14 also perform a switching operation in a mutually complimentary manner, so that when one of these switches is in an on-state, the other one is in an off-state. The switches Trch11 and Trch12 synchronize with each other and perform the same switching operation, so that these switches are in an on-state or an off-state simultaneously. The switches Trch13 and Trch14 also synchronize with each other and perform the same switching operation, so that these switches are in an on-state or an off-state simultaneously. The same switching operation means an operation by which all of a plurality of switches are set in an on-state simultaneously or set in an off-state simultaneously. The switches Trch11 to Trch14 repeat becoming on and off based on a control signal having a chopping frequency (a first frequency) that is higher than frequencies of signals input in the input ports InP and InN. With this operation, the first chopper switch unit SWch1 alternately switches a first input operation and a second input operation with the first frequency. In the first input operation, the first signal input from the input port InP and the second signal input from the input port InN are respectively input into the input ports In1 and In2. In the second input operation, the first signal input from the input port InP and the second signal input from the input port InN are respectively input into the input ports In2 and In1. That is, the first chopper switch unit SWch1 can transmit the first signal and the second signal to the operational amplifier AMP after modulating (chopping or converting) these signals with the first frequency.

The second chopper switch unit SWch2 is provided between the output ports Out1 and Out2 of the operational amplifier AMP and output ports OutN and OutP of the amplifier device 1, and includes switches Trch21 to Trch24. The switch Trch21 is connected between the output port Out1 and the output port OutN. The switch Trch22 is connected between the output port Out2 and the output port OutP. The switch Trch23 is connected between the output port Out1 and the output port OutP. The switch Trch24 is connected between the output port Out2 and the output port OutN. For example, each of the switches Trch21 to Trch24 can be a switch constituted by a CMOS transistor.

The switches Trch 21 and Trch 23 perform a switching operation in a mutually complimentary manner, so that when one of these switches is in an on-state, the other one is in an off-state. The switches Trch22 and Trch24 also perform a switching operation in a mutually complimentary manner, so that when one of these switches is in an on-state, the other one is in an off-state. The switches Trch21 and Trch22 synchronize with each other and perform a switching operation, and these switches are in an on-state or an off-state simultaneously. The switches Trch23 and Trch24 synchronize with each other and perform a switching operation, and these switches are in an on-state or an off-state simultaneously. The switches Trch21 to Trch24 also repeat becoming on and off by a control signal having a chopping frequency (a first frequency). That is, the second chopper switch unit SWch2 is controlled by a control signal common to a control signal controlling the first chopper switch unit SWch1, and thus these switch units operate as synchronizing with each other. With this operation, the second chopper switch unit SWch2 can demodulate after amplifying the chopped first and second signals. The demodulated first and second signals are respectively output from the output ports OutN and OutP of the amplifier device 1. That is, the first and second signals modulated and amplified with a chopping frequency are output from the output ports OutN and OutP after being reverted to their original frequencies.

With this configuration, for example, the amplifier device 1 can modulate a direct-current signal into an alternating-current signal with the first frequency at the first chopper switch unit SWch1, and after amplifying this alternating-current signal, the signal can be demodulated into a direct-current signal at the second chopper switch unit SWch2. With this configuration, the amplifier device 1 can amplify a signal while eliminating a DC offset voltage and 1/f noise therefrom.

The first phase compensation capacity element Cpc1 is connected to one of a segment between the output node N1 of the amplifier stage A1 and the output port Out1 of the operational amplifier AMP, or a segment between the output node N2 of the amplifier stage A1 and the output port Out2 of the operational amplifier AMP, and performs phase compensation of the modulated and amplified first signal. The second phase compensation capacity element Cpc2 is connected to the other of a segment between the output node N2 of the amplifier stage A1 and the output port Out2 of the operational amplifier AMP, or a segment between the output node N1 of the amplifier stage A1 and the output port Out1 of the operational amplifier AMP, and performs phase compensation of the modulated and amplified second signal. The phase compensation is performed in order to suppress oscillations that are generated when there is a phase difference between an output signal of the operational amplifier AMP and a feedback signal at the time of feeding back the output signal.

In order to switch connections of the first and second phase compensation capacity elements Cpc1 and Cpc2, the first capacitance switching unit SW0 includes a first switch unit SW1, a second switch unit SW2, a third switch unit SW3, and a fourth switch unit SW4. The first switch unit SW1 electrically connects or disconnects the first phase compensation capacity element Cpc1 between the output node (the first node) N1 of the amplifier stage A1 and the first output port Out1. The second switch unit SW2 electrically connects or disconnects the second phase compensation capacity element Cpc2 between the output node (the second node) N2 of the amplifier stage A1 and the second output port Out2. The third switch unit SW3 electrically connects or disconnects the first phase compensation capacity element Cpc1 between the second node N2 and the second output port Out2. The fourth switch unit SW4 electrically connects or disconnects the second phase compensation capacity element Cpc2 between the first node N1 and the first output port Out1.

The first switch unit SW1 includes a first switch Tr1 and a second switch Tr2. The first switch Tr1 is connected between the first node N1 and one end of the first phase compensation capacity element Cpc1. The second switch Tr2 is connected between the other end of the first phase compensation capacity element Cpc1 and the first output port Out1. The first and second switches Tr1 and Tr2 perform mutually the same switching operation.

The second switch unit SW2 includes a third switch Tr3 and a fourth switch Tr4. The third switch Tr3 is connected between the second node N2 and one end of the second phase compensation capacity element Cpc2. The fourth switch Tr4 is connected between the other end of the second phase compensation capacity element Cpc2 and the second output port Out2. The third and fourth switches Tr3 and Tr4 perform mutually the same switching operation.

The third switch unit SW3 includes a fifth switch Tr5 and a sixth switch Tr6. The fifth switch Tr5 is connected between the second node N2 and one end of the first phase compensation capacity element Cpc1. The sixth switch Tr6 is connected between the other end of the first phase compensation capacity element Cpc1 and the second output port Out2. The fifth and sixth switches Tr5 and Tr6 perform mutually the same switching operation.

The fourth switch unit SW4 includes a seventh switch Tr7 and an eighth switch Tr8. The seventh switch Tr7 is connected between the first node N1 and one end of the second phase compensation capacity element Cpc2. The eighth switch Tr8 is connected between the other end of the second phase compensation capacity element Cpc2 and the first output port Out1. The seventh and eighth switches Tr7 and Tr8 perform mutually the same switching operation.

For example, each of the first to eighth switches Tr1 to Tr8 can be a switch constituted by a CMOS transistor.

The first capacitance switching unit SW0 having such a configuration switches the connection state of the first and second phase compensation capacity elements Cpc1 and Cpc2 in either a first connection state or a second connection state. The first connection state is a state where the first phase compensation capacity element Cpc1 is connected between the first node N1 and the first output port Out1, and the second phase compensation capacity element Cpc2 is connected between the second node N2 and the second output port Out2. Meanwhile, the second connection state is a state where the first phase compensation capacity element Cpc1 is connected between the second node N2 and the second output port Out2, and the second phase compensation capacity element Cpc2 is connected between the first node N1 and the first output port Out1. As described later, in both the first and second connection states, the first phase compensation capacity element Cpc1 performs phase compensation of the first signal and the second phase compensation capacity element Cpc2 performs phase compensation of the second signal.

In order to realize the first and second connection states, the first switch unit SW1 and the third switch unit SW3 perform a switching operation in a mutually complementary manner while synchronizing with each other. The first switch unit SW2 and the third switch unit SW4 also perform a switching operation in a mutually complementary manner while synchronizing with each other.

Furthermore, the first and second switch units SW1 and SW2 synchronize with each other and perform the same switching operation (an on/off operation). The third and fourth switch units SW3 and SW4 synchronize with each other and perform the same switching operation (an on/off operation).

For example, in order to realize the first connection state, the first switch unit SW1 and the second switch unit SW2 are set to be an on-state, and the third switch unit SW3 and the fourth switch unit SW4 are set to be an off-state. In order to realize the second connection state, the third switch unit SW3 and the fourth switch unit SW4 are set to be an on-state, and the first switch unit SW1 and the second switch unit SW2 are set to be an off-state.

The switching cycle of the first and second connection states has the same cycle to a cycle of the chopping frequency (the first frequency) described above. That is, the first capacitance switching unit SW0 switches the connection state of the first and second phase compensation capacity elements Cpc1 and Cpc2 in a complimentary manner with the first frequency. With this configuration, the first and second phase compensation capacity elements Cpc1 and Cpc2 respectively perform phase compensation of the first signal and the second signal.

(First Connection State)

It is assumed here that the connection state shown in FIG. 1 is the first connection state. In this case, in the first chopper switch unit SWch1, the switches Trch11 and Trch12 are in an on-state and the switches Trch13 and Trch14 are in an off-state. Further, in the first capacitance switching unit SW0, the switches Tr1 to Tr4 are in an on-state and the switches Tr5 to Tr8 are in an off-state.

In this first connection state, the first chopper switch unit SWch1 connects the input ports InP and InN respectively to the input ports In1 and In2, transmits the first signal from the input port InP to the input port In1, and transmits the second signal from the input port InN to the input port In2. The first signal and the second signal amplified at the amplifier stage A1 are respectively transmitted to the nodes N1 and N2, and are respectively output from the output ports Out1 and Out2.

In this case, the first phase compensation capacity element Cpc1 being connected between the node N1 and the output port Out1 performs phase compensation of the first signal. The second phase compensation capacity element Cpc2 being connected between the node N2 and the output port Out2 performs phase compensation of the second signal. That is, in the first connection state, the first phase compensation capacity element Cpc1 keeps a charge that is needed to perform phase compensation of the first signal, and the second phase compensation capacity element Cpc2 keeps a charge that is needed to perform phase compensation of the second signal.

(Second Connection State)

Meanwhile, in the second connection state, in the first chopper switch unit SWch1, the switches Trch13 and Trch14 are in an on-state and the switches Trch11 and Trch12 are in an off-state. Further, in the first capacitance switching unit SW0, the switches Tr5 to Tr8 are in an on-state and the switches Tr1 to Tr4 are in an off-state. In this second connection state, the first chopper switch unit SWch1 connects (cross-connects) the input ports InP and InN respectively to the input ports In2 and In1, transmits the first signal from the input port InP to the input port In2, and transmits the second signal from the input port InN to the input port In1. The first signal and the second signal amplified at the amplifier stage A1 are respectively transmitted to the nodes N2 and N1, and are respectively output from the output ports Out2 and Out1.

In this case, the first phase compensation capacity element Cpc1 being connected between the node N2 and the output port Out2 performs phase compensation of the first signal. The second phase compensation capacity element Cpc2 being connected between the node N1 and the output port Out1 performs phase compensation of the second signal. That is, also in the second connection state, the first phase compensation capacity element Cpc1 keeps a charge that is needed to perform phase compensation of the first signal, and the second phase compensation capacity element Cpc2 keeps a charge that is needed to perform phase compensation of the second signal.

(Switching of First and Second Connection States)

In this example, the switching frequency of the first capacitance switching unit SW0 is substantially equal to the switching frequency (the first frequency) of the first chopper switch unit SWch1. Therefore, even when the first chopper switch unit SWch1 switches the first input operation and the second input operation with the first frequency as described above (that is, even when the input port of the first signal and the input port of the second signal are switched between the input ports In1 and In2 in complementary style by a chopping operation of the first chopper switch unit SWch1), the first capacitance switching unit SW0 synchronizes with the chopping operation and switches the connection of the first and second phase compensation capacity elements Cpc1 and Cpc2. That is, the first capacitance switching unit SW0 synchronizes with the chopping operation of the first chopper switch unit SWch1 to alternately switch the first and second connection states. Therefore, although the first signal and the second signal are chopped, the first phase compensation capacity element Cpc1 performs phase compensation of the first signal and the second phase compensation capacity element Cpc2 performs phase compensation of the second signal. With this configuration, the charge state (the voltage state) of each of the first and second phase compensation capacity elements Cpc1 and Cpc2 hardly needs to be changed.

For example, in a case where the first capacitance switching unit SW0 does not switch the connection state of the first and second phase compensation capacity elements Cpc1 and Cpc2, when the first chopper switch unit SWch1 switches the first input operation and the second input operation (that is, when the input ports of the first signal and the second signal is switched between the input port s In1 and In2 by a chopping operation of the first chopper switch unit SWch1), along with this switching, signals to be phase-compensated by the first and second phase compensation capacity elements Cpc1 and Cpc2 are also alternately switched between the first signal and the second signal. That is, when the first signal and the second signal are chopped, the first phase compensation capacity element Cpc1 alternately performs phase compensation of the first signal and the second signal, and the second phase compensation capacity element Cpc2 alternately performs phase compensation of the second signal and the first signal. In this case, the charge state (the voltage state) of each of the first and second phase compensation capacity elements Cpc1 and Cpc2 needs to be alternately shifted between a state where the second signal is phase-compensated and a state where the first signal is phase-compensated. In order to shift the charge state of the first and second phase compensation capacity elements Cpc1 and Cpc2, it is necessary to be given power supply from a power source. In this case, when a slew rate (an accumulated charge amount per unit time) is suppressed to be low in order to suppress consumption power to be low, shifting of the charge state of the first and second phase compensation capacity elements Cpc1 and Cpc2 takes a long time. On the other hand, when the slew rate is increased in order to shorten the time for shifting the charge state of the first and second phase compensation capacity elements Cpc1 and Cpc2, consumption power inevitably becomes large.

In contrast, in the amplifier device 1 according to the first embodiment, even when the first and second signals are chopped, the first phase compensation capacity element Cpc1 continuously performs phase compensation of the first signal and the second phase compensation capacity element Cpc2 continuously performs phase compensation of the second signal. In other words, in the first and second connection states, each of the first and second phase compensation capacity elements Cpc1 and Cpc2 can perform phase compensation of a signal while maintaining the charge state thereof. With this configuration, at the time of switching the connection state, the charge state of each of the first and second phase compensation capacity elements Cpc1 and Cpc2 hardly needs to be changed. That is, at the time of switching the connection state, it is not necessary to perform charging and discharging of the first and second phase compensation capacity elements Cpc1 and Cpc2. Therefore, the amplifier device 1 according to the first embodiment can shorten or eliminate the time for shifting of charge (shifting of voltage) between the first connection state and the second connection state while maintaining the slew rate to be low. As a result, the amplifier device 1 according to the first embodiment can make the operation speed thereof faster while maintaining its power consumption to be low.

Second Embodiment

Figure 2:
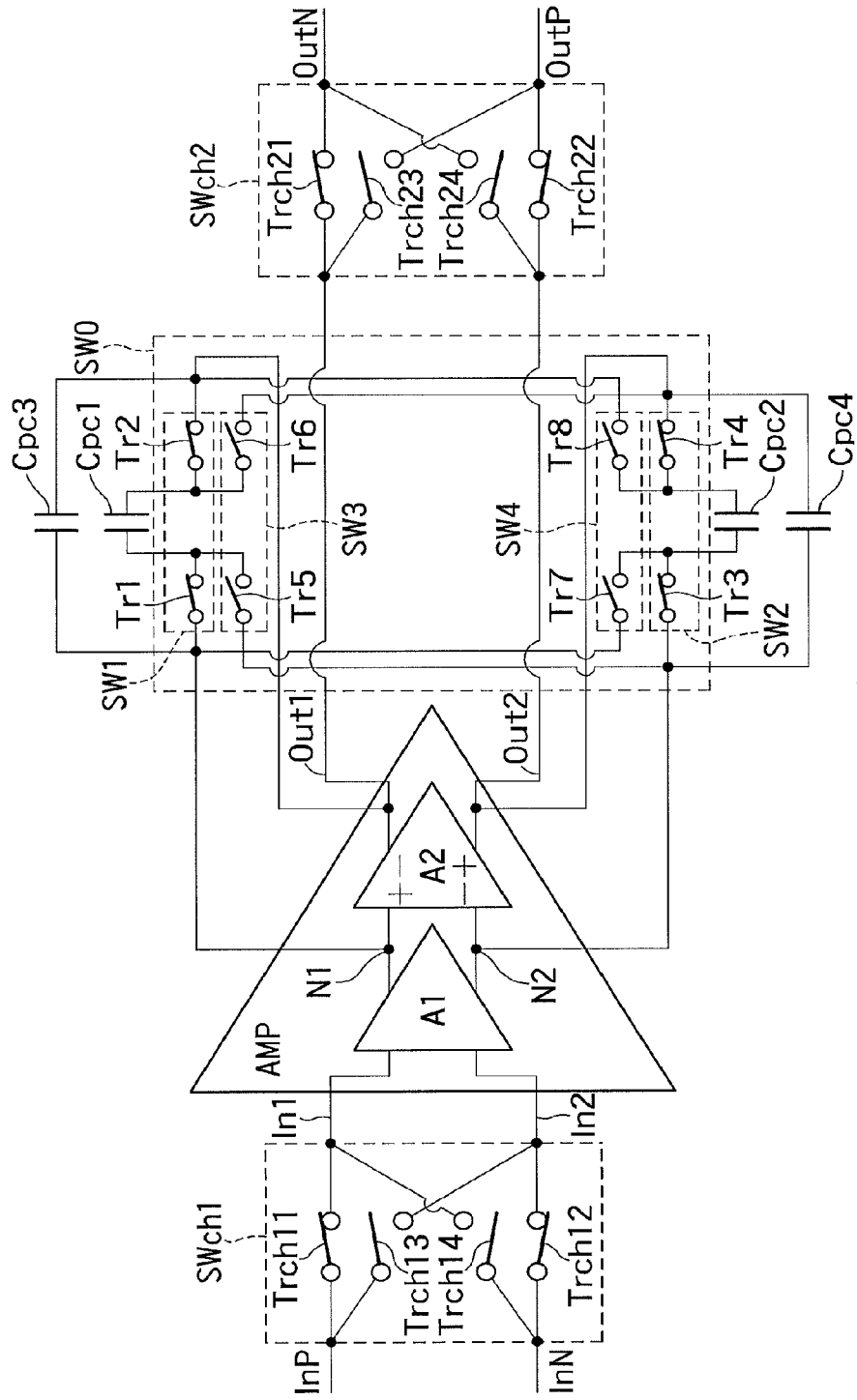
FIG. 2 shows a configuration example of a chopper operational amplifier device 2 according to a second embodiment.

FIG. 2 shows a configuration example of a chopper operational amplifier device 2 (hereinafter, also simply "amplifier device 2") according to a second embodiment. The amplifier device 2 further includes a third phase compensation capacity element Cpc3 and a fourth phase compensation capacity element Cpc4, in addition to the amplifier device 1. The third phase compensation capacity element Cpc3 is connected between the node N1 and the output port Out1. The fourth phase compensation capacity element Cpc4 is connected between the node N2 and the output port Out2. Other configurations of the second embodiment can be identical to corresponding ones of the first embodiment.

In the second embodiment, the third phase compensation capacity element Cpc3 is always connected between the node N1 and the output port Out1 regardless of the switching operations of the first chopper switch unit SWch1 and the first capacitance switching unit SW0. The fourth phase compensation capacity element Cpc4 is always connected between the node N2 and the output port Out2.

As described above, the first switch unit SW1 and the third switch unit SW3 perform a switching operation in a mutually complimentary manner with each other, and the second switch unit SW2 and the fourth switch unit SW4 perform a switching operation in a mutually complimentary manner with each other. The first switch unit SW1 and the third switch unit SW3 have a time period where both of these switch units are momentarily in an off-state. Furthermore, the second switch unit SW2 and the fourth switch unit SW4 have a time period where both of these switch units are momentarily in an off-state. In this case, if the third and fourth phase compensation capacity elements Cpc3 and Cpc4 are not provided, the operational amplifier AMP may oscillate.

In contrast, in the second embodiment, the third phase compensation capacity element Cpc3 is always connected between the node N1 and the output port Out1 and the fourth phase compensation capacity element Cpc4 is always connected between the node N2 and the output port Out2. Therefore, it is possible to suppress oscillations of the operational amplifier AMP in the shifting between the first connection state and the second connection state, and thus the amplifier device 2 can be stably operated.

Other operations of the second embodiment are identical to corresponding operations of the first embodiment. Therefore, the second embodiment can also achieve the effects of the first embodiment.

Third Embodiment

Figure 3:
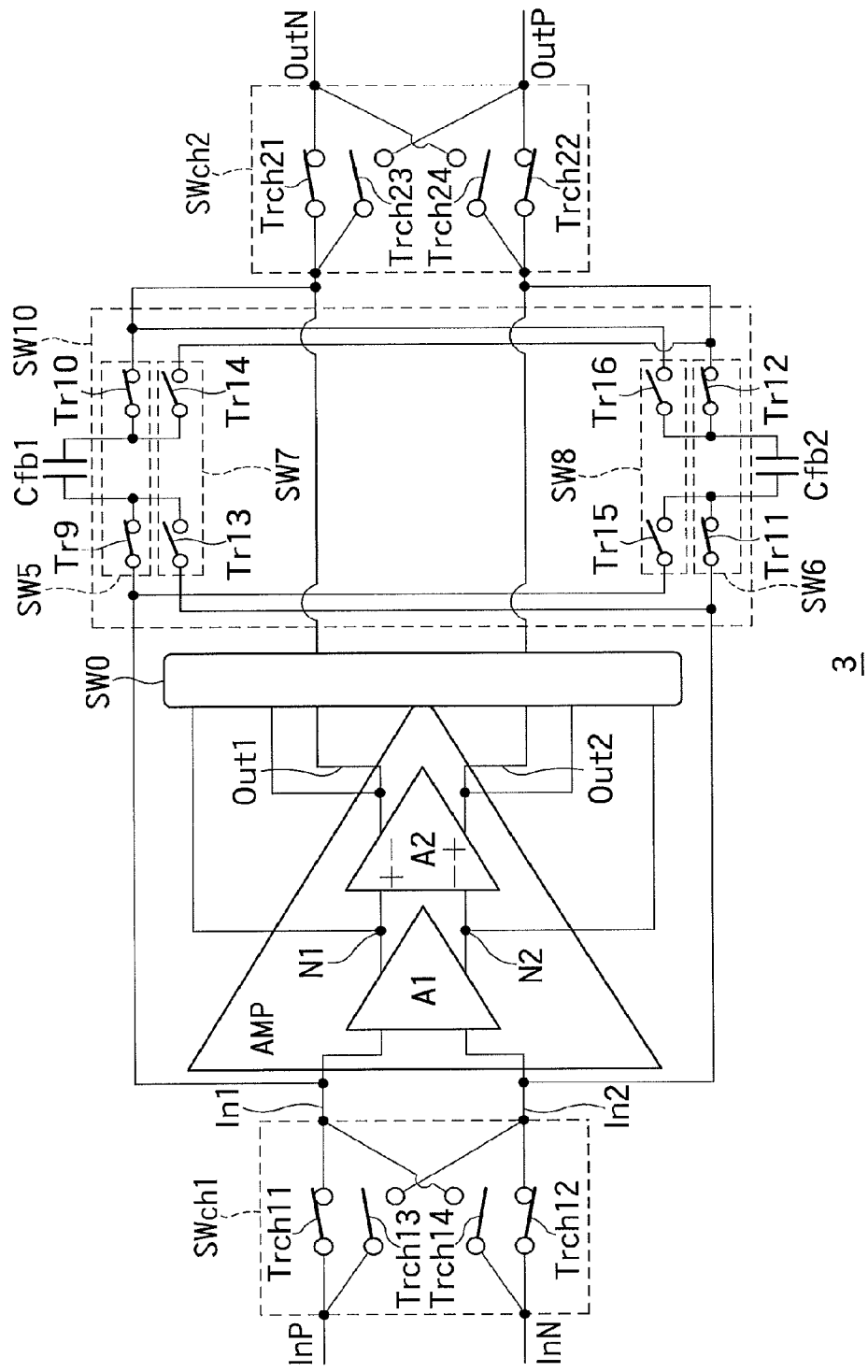
FIG. 3 shows a configuration example of a chopper operational amplifier device 3 according to a third embodiment.

FIG. 3 shows a configuration example of a chopper operational amplifier device 3 (hereinafter, also simply "amplifier device 3") according to a third embodiment. The amplifier device 3 further includes a first feedback capacity element Cfb1, a second feedback capacity element Cfb2, and a second capacitance switching unit SW10, in addition to the amplifier device 1. Other configurations of the third embodiment can be identical to corresponding ones of the first or second embodiment.

The first feedback capacity element Cfb1 feeds back a signal of the output port Out1 to the input port In1, or feeds back a signal of the output port Out2 to the input port In2. The second feedback capacity element Cfb2 feeds back a signal of the output port Out2 to the input port In2, or feeds back a signal of the output port Out1 to the input port In1.

The second capacitance switch unit SW10 includes fifth to eighth switch units SW5 to SW8. The fifth switch unit SW5 electrically connects or disconnects the first feedback capacity element Cfb1 between the input port In1 and the output port Out1. The sixth switch unit SW6 electrically connects or disconnects the second feedback capacity element Cfb2 between the input port In2 and the output port Out2. The seventh switch unit SW7 electrically connects or disconnects the first feedback capacity element Cfb1 between the input port In2 and the output port Out2. The eighth switch unit SW8 electrically connects or disconnects the second feedback capacity element Cfb2 between the input port In1 and the output port Out1.

The fifth switch unit SW5 includes a ninth switch Tr9 and a tenth switch Tr10. The ninth switch Tr9 is connected between the input port In1 and one end of the first feedback capacity element Cfb1. The tenth switch Tr10 is connected between the other end of the first feedback capacity element Cfb1 and the output port Out1. The ninth and tenth switches Tr9 and Tr10 perform mutually the same switching operation.

The sixth switch unit SW6 includes an eleventh switch Tr11 and a twelfth switch Tr12. The eleventh switch Tr11 is connected between the input port In2 and one end of the second feedback capacity element Cfb2. The twelfth switch Tr12 is connected between the other end of the second feedback capacity element Cfb2 and the output port Out2. The eleventh and twelfth switches Tr11 and Tr12 perform mutually the same switching operation.

The seventh switch unit SW7 includes a thirteenth switch Tr13 and a fourteenth switch Tr14. The thirteenth switch Tr13 is connected between the input port In2 and one end of the first feedback capacity element Cfb1. The fourteenth switch Tr14 is connected between the other end of the first feedback capacity element Cfb1 and the output port Out2. The thirteenth and fourteenth switches Tr13 and Tr14 perform mutually the same switching operation.

The eighth switch unit SW8 includes a fifteenth switch Tr15 and a sixteenth switch Tr16. The fifteenth switch Tr15 is connected between the input port In1 and one end of the second feedback capacity element Cfb2. The sixteenth switch Tr16 is connected between the other end of the second feedback capacity element Cfb2 and the output port Out1. The fifteenth and sixteenth switches Tr15 and Tr16 perform mutually the same switching operation.

For example, each of the ninth to sixteenth switches Tr9 to Tr16 can be a switch constituted by a CMOS transistor.

The second capacitance switching unit SW10 having such a configuration switches the connection state of the first and second feedback capacity elements Cfb1 and Cfb2 in either a third connection state or a fourth connection state. The third connection state is a state where the first feedback capacity element Cfb1 is connected between the output port Out1 and the input port In1, and the second feedback capacity element Cfb2 is connected between the output port Out2 and the input port In2. In the third connection state, the first feedback capacity element Cfb1 feeds back an output signal of the output port Out1 to the input port In1, and the second feedback capacity element Cfb2 feeds back an output signal of the output port Out2 to the input port In2. The fourth connection state is a state where the first feedback capacity element Cfb1 is connected between the output port Out2 and the input port In2, and the second feedback capacity element Cfb2 is connected between the output port Out1 and the input port In1. In the fourth connection state, the first feedback capacity element Cfb1 feeds back an output signal of the output port Out2 to the input port In2, and the second feedback capacity element Cfb2 feeds back an output signal of the output port Out1 to the input port In1.

In order to realize the third and fourth connection states, the fifth switch unit SW5 and the seventh switch unit SW7 perform a switching operation in a mutually complementary manner while synchronizing with each other. The sixth switch unit SW6 and the eighth switch unit SW8 also perform a switching operation in a mutually complementary manner while synchronizing with each other.

Furthermore, the fifth and sixth switch units SW5 and SW6 synchronize with each other and perform the same switching operation (an on/off operation). The seventh and eighth switch units SW7 and SW8 synchronize with each other and perform the same switching operation (an on/off operation).

For example, in order to realize the third connection state, the fifth switch unit SW5 and the sixth switch unit SW6 are set to be an on-state, and the seventh switch unit SW7 and the eighth switch unit SW8 are set to be an off-state. In order to realize the fourth connection state, the seventh switch unit SW7 and the eighth switch unit SW8 are set to be an on-state, and the fifth switch unit SW5 and the sixth switch unit SW6 are set to be an off-state.

The switching cycle of the third and fourth connection states has the same frequency to the chopping frequency (the first frequency) described above. That is, the second capacitance switching unit SW10 switches the connection state of the first and second phase compensation capacity elements Cpc1 and Cpc2 in a complimentary manner with the first frequency, thereby feeding back the first signal and the second signal.

(Third Connection State)

It is assumed here that the connection state shown in FIG. 3 is the third connection state. In this case, in the first chopper switch unit SWch1, the switches Trch11 and Trch12 are in an on-state and the switches Trch13 and Trch14 are in an off-state. Further, in the second capacitance switching unit SW10, the switches Tr9 to Tr12 are in an on-state and the switches Tr13 to Tr16 are in an off-state. In this third connection state, the first chopper switch unit SWch1 connects the input ports InP and InN respectively to the input ports In1 and In2, transmits the first signal from the input port InP to the input port In1, and transmits the second signal from the input port InN to the input port In2.

The first signal and the second signal amplified by the operational amplifier AMP are respectively output from the output ports Out1 and Out2.

In this case, the first feedback capacity element Cfb1 being connected between the output port Out1 and the input port In1 feeds back the first signal from the output port Out1 to the input port In1. The second feedback capacity element Cfb2 being connected between the output port Out2 and the input port In2 feeds back the second signal from the output port Out2 to the input port In2. That is, in the third connection state, the first feedback capacity element Cfb1 keeps a charge that is needed to feed back the first signal, and the second feedback capacity element Cfb2 keeps a charge that is needed to feed back the second signal.

(Fourth Connection State)

Meanwhile, in a fourth embodiment, in the first chopper switch unit SWch1, the switches Trch13 and Trch14 are in an on-state and the switches Trch11 and Trch12 are in an off-state. Further, in the second capacitance switching unit SW10, the switches Tr13 to Tr16 are in an on-state and the switches Tr9 to Tr12 are in an off-state. In this fourth connection state, the first chopper switch unit SWch1 connects (cross-connects) the input ports InP and InN respectively to the input ports In2 and In1, transmits the first signal from the input port InP to the input port In2, and transmits the second signal from the input port InN to the input port In1. The first signal and the second signal amplified by the operational amplifier AMP are respectively output from the output ports Out2 and Out1.

In this case, the first feedback capacity element Cfb1 being connected between the output port Out2 and the input port In2 feeds back the first signal from the output port Out2 to the input port In2. The second feedback capacity element Cfb2 being connected between the output port Out1 and the input port In1 feeds back the second signal from the output port Out1 to the input port In1. That is, also in the fourth connection state, the first feedback capacity element Cfb1 keeps a charge that is needed to feed back the first signal, and the second feedback capacity element Cfb2 keeps a charge that is needed to feed back the second signal.

(Switching of Third and Fourth Connection States)

In this example, the switching frequency of the second capacitance switching unit SW10 is substantially equal to the switching frequency (the first frequency) of the first chopper switch unit SWch1. Therefore, even when the first chopper switch unit SWch1 switches the first input operation and the second input operation with the first frequency (that is, when the input port of the first signal and the input port of the second signal are alternately switched between the input ports In1 and In2 in complementary style by a chopping operation of the first chopper switch unit SWch1), the second capacitance switching unit SW10 synchronizes with the chopping operation and switches the connection of the first and second feedback capacity elements Cfb1 and Cfb2. That is, the second capacitance switching unit SW10 synchronizes with the chopping operation of the first chopper switch unit SWch1 to alternately switch the third and fourth connection states. Therefore, although the first signal and the second signal are chopped, the first feedback capacity element Cfb1 feeds back the first signal from the output port Out1 or Out2 to the input port In1 or In2 and the second feedback capacity element Cfb2 feeds back the second signal from the output port Out2 or Out1 to the input port In2 or In1. With this configuration, the charge state (the voltage state) of each of the first and second feedback capacity elements Cfb1 and Cfb2 hardly needs to be changed.

Therefore, in the third embodiment, even when the first and second signals are chopped, the first feedback capacity element Cfb1 continuously feeds back the first signal and the second feedback capacity element Cfb2 continuously feeds back the second signal. In other words, in the third and fourth connection states, each of the first and second feedback capacity elements Cfb1 and Cfb2 can feed back a signal while maintaining the charge state thereof. With this configuration, at the time of switching the connection state, the charge state of each of the first and second feedback capacity elements Cfb1 and Cfb2 hardly needs to be changed. That is, at the time of switching the connection state, it is not necessary to perform charging and discharging of the first and second feedback capacity elements Cfb1 and Cfb2. Therefore, the amplifier device 3 according to the third embodiment can shorten or eliminate the time for shifting of charge (shifting of voltage) between the third connection state and the fourth connection state while maintaining the slew rate to be low. As a result, the amplifier device 3 according to the third embodiment can make the operation speed thereof faster while maintaining its power consumption to be low. The third embodiment can be applied to a case where a feedback capacity element is added to the operational amplifier AMP with an active filter or the like. The feedback capacity element is, for example, provided to constitute a low-pass filter while suppressing a high frequency of a signal.

The third embodiment can be combined with the first or second embodiment. Therefore, the third embodiment can also achieve the effects of the first or second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit device comprising:
an operational amplifier including an amplifier unit amplifying signals input in a first input port and a second input port and transmitting amplified signals to a first node and a second node, and an output unit being connected to the amplifier unit at the first and second nodes and outputting the amplified signals from a first output port and a second output port;
a first chopper switch unit modulating a first signal and a second signal and inputting the modulated first and the second signals in the first and second input ports;
a second chopper switch unit demodulating and outputting the amplified signals output from the first and second output ports;
a first phase compensation capacity element;
a second phase compensation capacity element; and
a first capacitance switching unit switching between a first connection state and a second connection state, the first connection state being a state where the first phase compensation capacity element is connected between the first node and the first output port and the second phase compensation capacity element is connected between the second node and the second output port, the second connection state being a state where the first phase compensation capacity element is connected between the second node and the second output port and the second phase compensation capacity element is connected between the first node and the first output port.

2. The device of claim 1, wherein
the first chopper switch unit alternately operates a first input operation and a second input operation with a first frequency, the first and second signals being respectively input in the first input port and the second input port in the first input operation, and the first and second signals being respectively input in the second input port and the first input port in the second input operation,
the first capacitance switching unit switches the first connection state and the second connection state with the first frequency, and
the second chopper switch unit demodulates the amplified signals from the first and second output ports with the first frequency and outputs the demodulated signals.

3. The device of claim 1, wherein the first capacitance switching unit includes a first switch unit electrically connecting and disconnecting the first phase compensation capacity element between the first node and the first output port, a second switch unit electrically connecting and disconnecting the second phase compensation capacity element between the second node and the second output port, a third switch unit electrically connecting and disconnecting the first phase compensation capacity element between the second node and the second output port, and a fourth switch unit electrically connecting and disconnecting the second phase compensation capacity element between the first node and the first output port.

4. The device of claim 2, wherein the first capacitance switching unit includes a first switch unit electrically connecting and disconnecting the first phase compensation capacity element between the first node and the first output port, a second switch unit electrically connecting and disconnecting the second phase compensation capacity element between the second node and the second output port, a third switch unit electrically connecting and disconnecting the first phase compensation capacity element between the second node and the second output port, and a fourth switch unit electrically connecting and disconnecting the second phase compensation capacity element between the first node and the first output port.

5. The device of claim 3, wherein
the first switch unit includes a first switch being connected between the first node and one end of the first phase compensation capacity element, and a second switch being connected between the other end of the first phase compensation capacity element and the first output port,
the second switch unit includes a third switch being connected between the second node and one end of the second phase compensation capacity element, and a fourth switch being connected between the other end of the second phase compensation capacity element and the second output port,
the third switch unit includes a fifth switch being connected between the second node and one end of the first phase compensation capacity element, and a sixth switch being connected between the other end of the first phase compensation capacity element and the second output port, and
the fourth switch unit includes a seventh switch being connected between the first node and one end of the second phase compensation capacity element, and an eighth switch being connected between the other end of the second phase compensation capacity element and the first output port.

6. The device of claim 4, wherein
the first switch unit includes a first switch being connected between the first node and one end of the first phase compensation capacity element, and a second switch being connected between the other end of the first phase compensation capacity element and the first output port,
the second switch unit includes a third switch being connected between the second node and one end of the second phase compensation capacity element, and a fourth switch being connected between the other end of the second phase compensation capacity element and the second output port,
the third switch unit includes a fifth switch being connected between the second node and one end of the first phase compensation capacity element, and a sixth switch being connected between the other end of the first phase compensation capacity element and the second output port, and
the fourth switch unit includes a seventh switch being connected between the first node and one end of the second phase compensation capacity element, and an eighth switch being connected between the other end of the second phase compensation capacity element and the first output port.

7. The device of claim 3, wherein
the first and second switch units perform a same switching operation with the first frequency,
the third and fourth switch units perform a same switching operation with the first frequency,
the first switch unit and the third switch unit perform a switching operation with the first frequency in a mutually complementary manner, and
the second switch unit and the fourth switch unit perform a switching operation with the first frequency in a mutually complementary manner.

8. The device of claim 5, wherein
the first and second switch units perform a same switching operation with the first frequency,
the third and fourth switch units perform a same switching operation with the first frequency,
the first switch unit and the third switch unit perform a switching operation with the first frequency in a mutually complementary manner, and
the second switch unit and the fourth switch unit perform a switching operation with the first frequency in a mutually complementary manner.

9. The device of claim 1, further comprising:
a third phase compensation capacity element being connected between the first node and the first output port; and
a fourth phase compensation capacity element being connected between the second node and the second output port.

10. The device of claim 2, further comprising:
a third phase compensation capacity element being connected between the first node and the first output port; and
a fourth phase compensation capacity element being connected between the second node and the second output port.

11. The device of claim 3, further comprising:
a third phase compensation capacity element being connected between the first node and the first output port; and
a fourth phase compensation capacity element being connected between the second node and the second output port.

12. The device of claim 1, further comprising:
a first feedback capacity element;
a second feedback capacity element; and
a second capacitance switching unit switching between a third connection state and a fourth connection state, the third connection state being a state where the first feedback capacity element is connected between the first output port and the first input port and the second feedback capacity element is connected between the second output port and the second input port, the fourth connection state being a state where the first feedback capacity element is connected between the second output port and the second input port and the second feedback capacity element is connected between the first output port and the first input port.

13. The device of claim 2, further comprising:
a first feedback capacity element;
a second feedback capacity element; and
a second capacitance switching unit switching between a third connection state and a fourth connection state, the third connection state being a state where the first feedback capacity element is connected between the first output port and the first input port and the second feedback capacity element is connected between the second output port and the second input port, the fourth connection state being a state where the first feedback capacity element is connected between the second output port and the second input port and the second feedback capacity element is connected between the first output port and the first input port.

14. The device of claim 3, further comprising:
a first feedback capacity element;
a second feedback capacity element; and
a second capacitance switching unit switching between a third connection state and a fourth connection state, the third connection state being a state where the first feedback capacity element is connected between the first output port and the first input port and the second feedback capacity element is connected between the second output port and the second input port, the fourth connection state being a state where the first feedback capacity element is connected between the second output port and the second input port and the second feedback capacity element is connected between the first output port and the first input port.

15. The device of claim 12, wherein the second capacitance switching unit includes a fifth switch unit electrically connecting and disconnecting the first feedback capacity element between the first input port and the first output port, a sixth switch unit electrically connecting and disconnecting the second feedback capacity element between the second input port and the second output port, a seventh switch unit electrically connecting and disconnecting the first feedback capacity element between the second input port and the second output port, and an eighth switch unit electrically connecting and disconnecting the second feedback capacity element between the first input port and the first output port.

16. The device of claim 15, wherein
the fifth switch unit includes a ninth switch being connected between the first input port and one end of the first feedback capacity element, and a tenth switch being connected between the other end of the first feedback capacity element and the first output port,
the sixth switch unit includes an eleventh switch being connected between the second input port and one end of the second feedback capacity element, and a twelfth switch being connected between the other end of the second feedback capacity element and the second output port,
the seventh switch unit includes a thirteenth switch being connected between the second input port and one end of the first feedback capacity element, and a fourteenth switch being connected between the other end of the first feedback capacity element and the second output port, and
the eighth switch unit includes a fifteenth switch being connected between the first input port and one end of the second feedback capacity element, and a sixteenth switch being connected between the other end of the second feedback capacity element and the first output port.

* * * * *